(12) United States Patent
Xi (10) Patent No.: US 11,978,636 B2
(45) Date of Patent: May 7, 2024

(54) METHODS FOR PROCESSING SEMICONDUCTOR STRUCTURES AND METHODS FOR FORMING SEMICONDUCTOR STRUCTURES

(71) Applicant: CHANGXIN MEMORY TECHNOLOGIES, INC., Anhui (CN)

(72) Inventor: Ning Xi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 405 days.

(21) Appl. No.: 17/438,454

(22) PCT Filed: May 24, 2021

(86) PCT No.: PCT/CN2021/095582
§ 371 (c)(1),
(2) Date: Sep. 12, 2021

(87) PCT Pub. No.: WO2022/001486
PCT Pub. Date: Jan. 6, 2022

(65) Prior Publication Data
US 2023/0053945 A1    Feb. 23, 2023

(30) Foreign Application Priority Data
Jul. 2, 2020    (CN) .......................... 202010634483.6

(51) Int. Cl.
*H01L 21/308*    (2006.01)
*H01L 21/02*    (2006.01)

(52) U.S. Cl.
CPC .... *H01L 21/3085* (2013.01); *H01L 21/02057* (2013.01)

(58) Field of Classification Search
None
See application file for complete search history.

(56) References Cited

U.S. PATENT DOCUMENTS 4,961,820 A    10/1990    Shinagawa et al.
6,405,399 B1    6/2002    Farber et al.
(Continued)

FOREIGN PATENT DOCUMENTS

CN    101330035 A    12/2008
CN    101606231 A    12/2009
(Continued)

OTHER PUBLICATIONS

First Office Action cited in EP21816301.2 mailed Mar. 16, 2023, 6 pages.
(Continued)

*Primary Examiner* — Eric W Golightly
*Assistant Examiner* — Arlyn I Rivera-Cordero
(74) *Attorney, Agent, or Firm* — Cooper Legal Group, LLC (57) ABSTRACT

Embodiments of the present application provide a method for processing a semiconductor structure and a method for forming a semiconductor structure. The method for processing a semiconductor structure includes: providing a semiconductor substrate, the semiconductor substrate being provided with a feature portion, the aspect ratio of the feature portion being greater than a preset aspect ratio, a mask layer being provided on the top of the feature portion; ashing a semiconductor structure, the semiconductor structure comprising the semiconductor substrate, the feature portion, and the mask layer; cleaning the semiconductor structure; drying the semiconductor structure; and removing the mask layer.

16 Claims, 6 Drawing Sheets

(56) References Cited

U.S. PATENT DOCUMENTS

| | | | |
|---|---|---|---|
| 7,682,986 | B2 | 3/2010 | Chi et al. |
| 8,440,573 | B2 | 5/2013 | Mikhaylichenko et al. |
| 8,791,027 | B2 | 7/2014 | Kofuji et al. |
| 9,196,472 | B2 | 11/2015 | Ohto et al. |
| 9,953,840 | B2 | 4/2018 | Marumoto et al. |
| 9,991,116 | B1 | 6/2018 | Liu et al. |
| 10,068,781 | B2 | 9/2018 | Sirard et al. |
| 2005/0022839 | A1 | 2/2005 | Savas et al. |
| 2007/0059941 | A1 | 3/2007 | Park et al. |
| 2008/0124909 | A1* | 5/2008 | Lee .................... C11D 7/08 134/26 |
| 2010/0240219 | A1 | 9/2010 | Tomita et al. |
| 2011/0183522 | A1 | 7/2011 | Mikhaylichenko et al. |
| 2011/0189858 | A1 | 8/2011 | Yasseri et al. |
| 2012/0088357 | A1 | 4/2012 | Ogawa et al. |
| 2014/0170853 | A1 | 6/2014 | Shamma et al. |
| 2016/0020211 | A1 | 1/2016 | Yang et al. |
| 2017/0186620 | A1 | 6/2017 | Marumoto et al. |
| 2017/0294344 | A1 | 10/2017 | Asako |
| 2017/0358662 | A1* | 12/2017 | Chi .................... H01L 29/7853 |
| 2018/0076022 | A1 | 3/2018 | Choi et al. |
| 2019/0066999 | A1 | 2/2019 | Sarashina et al. |
| 2019/0067047 | A1 | 2/2019 | Tanizawa et al. |
| 2020/0098639 | A1* | 3/2020 | Seshadri ......... H01L 21/02181 |

FOREIGN PATENT DOCUMENTS

| | | |
|---|---|---|
| CN | 101908480 A | 12/2010 |
| CN | 102484056 A | 5/2012 |
| CN | 102714155 A | 10/2012 |
| CN | 105489529 A | 4/2016 |
| CN | 106229288 A | 12/2016 |
| CN | 106856163 A | 6/2017 |
| CN | 106920743 A | 7/2017 |
| CN | 208142187 U | 11/2018 |
| EP | 3951837 A1 | 2/2022 |
| JP | H0277125 A | 3/1990 |
| JP | 2003503845 A | 1/2003 |
| JP | 2004172573 A | 6/2004 |
| JP | 2010114414 A | 5/2010 |
| JP | 2015144249 A | 8/2015 |
| JP | 2016063141 A | 4/2016 |
| JP | 2016154209 A | 8/2016 |
| JP | 2017118026 A | 6/2017 |
| JP | 2017168785 A | 9/2017 |
| JP | 2019046939 A | 3/2019 |
| WO | 2015098812 A1 | 7/2015 |

OTHER PUBLICATIONS

Final Office Action cited in U.S. Appl. No. 17/444,055, mailed Feb. 2, 2023, 33 pages.
International Search Report cited in PCT/CN2021/095582 mailed Aug. 23, 2021, 10 pages.
European Search Report cited in EP21816301.2 mailed Jul. 6, 2022, 10 pages.
Non-Final Office Action cited in U.S. Appl. No. 17/444,055, mailed Aug. 18, 2022, 20 pages.
International Search Report cited in PCT/CN2021/095589 mailed Aug. 24, 2021, 4 pages.
JP Office Action cited in JP2022-545348, mailed Aug. 22, 2023, 8 pages.
KR Office Action cited in KR10-2022-7026250, mailed Feb. 6, 2024, 10 pages.

* cited by examiner

METHODS FOR PROCESSING SEMICONDUCTOR STRUCTURES AND METHODS FOR FORMING SEMICONDUCTOR STRUCTURES

CROSS-REFERENCE TO RELATED APPLICATIONS

The present application claims priority to Chinese Patent Application 202010634483.6, titled "METHODS FOR PROCESSING SEMICONDUCTOR STRUCTURES AND METHODS FOR FORMING SEMICONDUCTOR STRUCTURES", filed on Jul. 2, 2020, which is incorporated herein by reference in its entirety.

TECHNICAL FIELD

The present application relates to the semiconductor field and relates to a method for processing a semiconductor structure and a method for forming a semiconductor structure.

BACKGROUND

In the semiconductor manufacturing process, multiple processing steps are usually required, for example material deposition, planarization, feature patterning, etching, cleaning, and the like. With the increasingly reduced integrated circuit size and the increasingly complex manufacturing processes, high-aspect-ratio structures are becoming more and more important. Due to the reduction in size, the depth of the feature portion remains unchanged or becomes larger and the width of the feature portion becomes smaller, resulting in the increased aspect ratio of the feature portion. The process for the high-aspect-ratio structure (HAR) is prone to problems such as lateral bending, top CD and bottom CD changes, necking, tilting, and graphic distortion. How to improve the quality of the HAR structure and prevent the HAR structure from tilt is an urgent problem to be solved.

SUMMARY

An embodiment of the present application provides a method for processing a semiconductor structure, comprising: providing a semiconductor substrate, the semiconductor substrate being provided with feature portions, an aspect ratio of feature portions being greater than a preset aspect ratio, mask layers being provided on a top of feature portions; ashing a semiconductor structure, the semiconductor structure comprising the semiconductor substrate, the feature portions, and the mask layers; cleaning the semiconductor structure; drying the semiconductor structure; and removing the mask layers; wherein, during the drying process, one mask layer in at least a set of adjacent mask layers is tilted toward the adjacent mask layer, and after the drying process, the distance between the tilted mask layer and the adjacent mask layer is less than the distance between the two before the drying process.

The feature portion is a high-aspect-ratio structure. The tilt of the feature means the tilt of the high-aspect-ratio structure. The feature portion is kept to be vertical to avoid the tilt of the high-aspect-ratio structure.

Specifically, taking the semiconductor substrate being a wafer as an example, the process is to provide hot deionized water to the back of the wafer in the drying process while providing heated isopropanol to the front of the wafer. The reason is that, if the back of the wafer is not heated, the temperature of isopropanol reaching the surface of the wafer will decrease. Providing hot deionized water to the back is to control the temperature of the wafer, to prevent the difference in temperature between the center and the edge of the wafer. This can further strengthen the drying effect of isopropanol, so as to better dry the wafer.

An embodiment of the present application further provides a method for forming a semiconductor structure, comprising: providing a semiconductor substrate and a mask layer on the semiconductor substrate; etching, by using the mask layer as a mask, the semiconductor substrate to form discrete feature portions, an aspect ratio of the feature portions being greater than a preset aspect ratio; sequentially ashing, cleaning and drying the semiconductor structure, the semiconductor structure comprising the semiconductor substrate, the feature portions, and the mask layer; and removing the mask layer.

DETAILED DESCRIPTION

The tilt of the high-aspect-ratio structure due to capillary force is a serious problem that may lead to semiconductor defects. With the increase in semiconductor integration, the use of high-aspect-ratio structures has become more common. The high-aspect-ratio structure may be a feature portion having an aspect ratio greater than 5:1, 10:1, or 20:1. In a high-aspect-ratio structure, especially in a high-aspect-ratio structure having an aspect ratio of above 10, during the cleaning and drying process, the HAR structure will tilt or even collapse due to capillary force. The higher the aspect ratio is, the more serious the tilt is.

However, it was found that methods to reduce the tilt of the HAR structure have been developed and applied. For example, in the wafer cleaning process, supercritical carbon dioxide is used for drying. This process is extremely expensive and usually requires precise control. It is necessary to precisely weigh the isopropanol required by the drying process. Moreover, supercritical carbon dioxide requires high pressure to reach the critical point.

Therefore, there is an urgent need for a low-cost and simple processing method to reduce the tilt of the high-aspect-ratio structure when cleaning the high-aspect-ratio structure.

In order to solve the above technical problems, an embodiment of the present application provides a method for processing a semiconductor structure, comprising: providing a semiconductor substrate, the semiconductor substrate being provided with feature portions, an aspect ratio of the feature portions being greater than a preset aspect ratio, mask layers being provided on a top of the feature portions; ashing a semiconductor structure, the semiconductor structure comprising the semiconductor substrate, the feature portions, and the mask layers; cleaning the semiconductor structure; drying the semiconductor structure; and removing the mask layers; wherein, during the drying process, one mask layer in at least a set of adjacent mask layers is tilted toward the adjacent mask layer, and after the drying process, the distance between the tilted mask layer and the adjacent mask layer is less than the distance between the two before the drying process.

To make the objectives, technical solutions and advantages of the embodiments of the present application are more clearly, the embodiments of the present application will be further described below in detail with reference to the accompanying drawings. However, it may be understood by a person of ordinary skill in the art that, in the embodiments of the present application, many technical details are provided for the better understanding of the present application. However, the technical solutions sought to be protected by the present application can be implemented, even without these technical details and various changes and modifications based on the following embodiments. The following divisions of the various embodiments are for convenience of description, and should not constitute any limitation to the specific implementation of the present application, and the various embodiments may be combined with each other if not conflict.

FIGS. 1-6 are schematic cross-sectional structure diagrams corresponding to steps of the method for processing a semiconductor structure according to an embodiment of the present application. The method for processing a semiconductor structure in this embodiment will be specifically described below.

Figure 1:
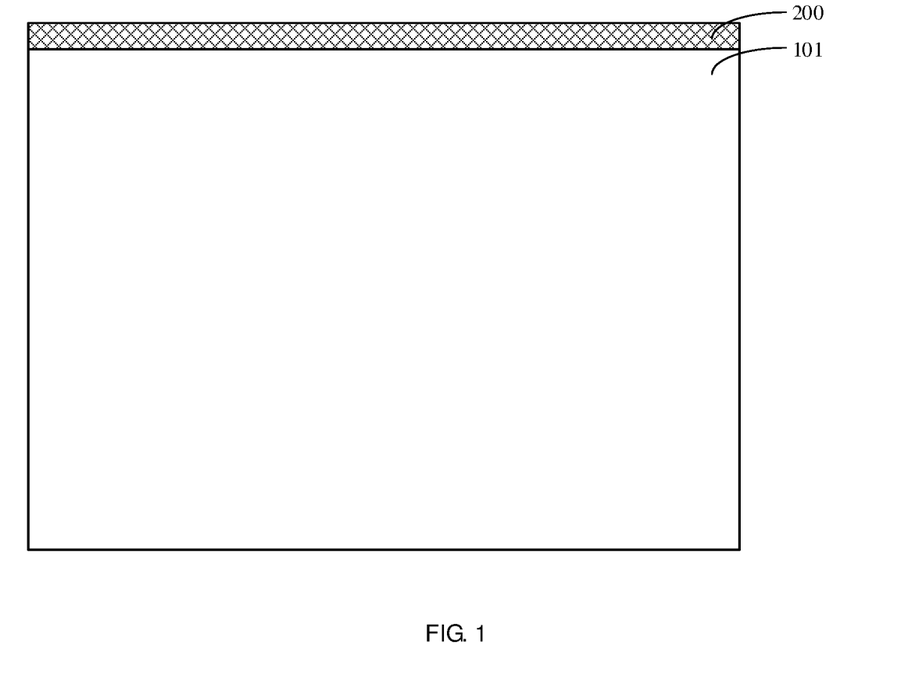
FIGS. 1-6 are schematic cross-sectional structure diagrams corresponding to steps of a method for processing a semiconductor structure according to an embodiment of the present application.
Figure 2:
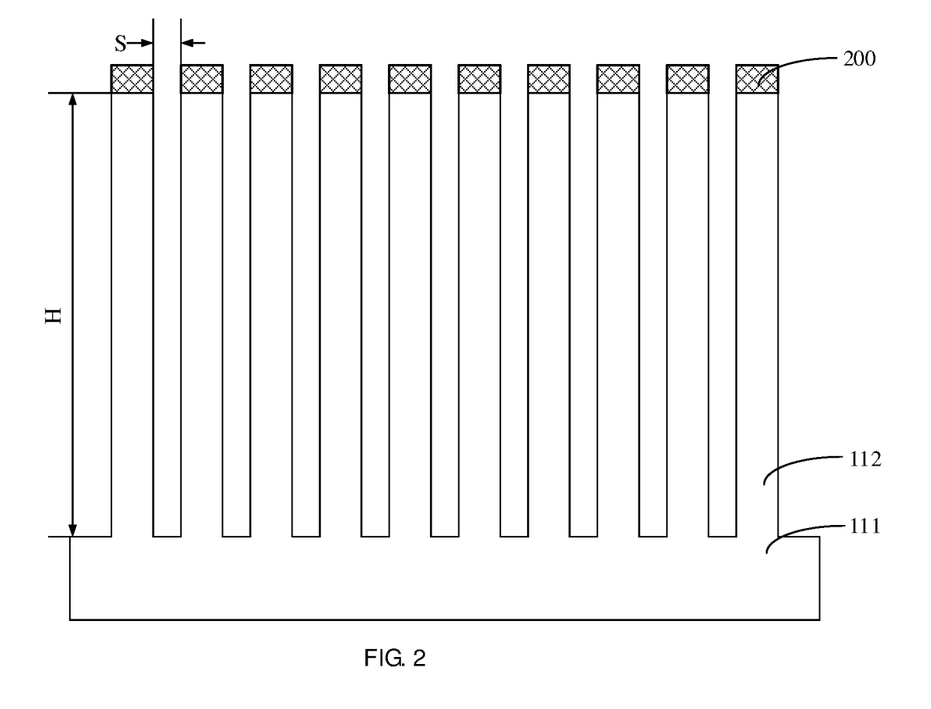

Referring to FIGS. 1 and 2, a semiconductor substrate 111 is provided. The semiconductor substrate 111 is provided with feature portions 112. mask layers 200 are provided on top surfaces of the feature portions 112. The aspect ratio of the feature portions is greater than a preset aspect ratio.

Specifically, referring to FIG. 1, a mask layer 200 is formed on a substrate 101. The substrate 101 is etched based on the mask layer 200 to form a semiconductor substrate 111 and discrete feature portions 112 as shown in FIG. 2. The mask layers 200 are provided on the feature portions 112.

In this embodiment, the semiconductor substrate 111 is formed of materials such as silicon or germanium, and the mask layer 200 is formed of silicon dioxide. In other embodiments, the mask layer 200 may be formed of other insulating materials, for example silicon nitride or silicon oxynitride, etc.

In addition, the feature portions 112 provided in this embodiment are used subsequently to form active areas. The tilt of the feature portions 112 will cause the tilt of the formed active areas. That is, the feature portions 112 are kept to be vertical to avoid the tilt of the active areas.

Referring to FIG. 2, the height of the feature portions 112 is H, the gap between the discrete feature portions 112 is S, and the aspect ratio H/S of the feature portions 112 is greater than a preset aspect ratio. In this embodiment, the preset aspect ratio is 10. That is, the aspect ratio of the feature portions 112 is greater than 10. Accordingly, the aspect ratio of protrusions formed by the feature portions 112 and the mask layers 200 is greater than the aspect ratio of the feature portions 112. In other embodiments, the preset aspect ratio may be 5, 8, 12, 15, etc., which may be set according to actual needs. In the semiconductor process where the feature portions have a high aspect ratio, the tilt of the feature portions 112 may be caused. It may be understood by those skilled in the art that the limitation to the aspect ratio of the feature portions 112 in this embodiment is to ensure the tilt of the feature portions 112 in the subsequent drying process, and all technical solutions in which the subsequent tilt of the feature portions 112 is ensured by the limitation to the aspect ratio should fall into the protection scope of the present application.

The semiconductor structure is ashed. The semiconductor structure comprises a semiconductor substrate 111, the feature portions 112, and the mask layers 200. In this embodiment, the semiconductor substrate 111 and the feature portion 112 are ashed. The ashing process is to ash the remaining etching gas or etching liquid to prevent the remaining etching gas or etching liquid from continuing to etch the semiconductor substrate 111 and the feature portion 112.

Specifically, this embodiment provides following two ashing methods.

Oxygen-free ashing: the semiconductor substrate 111 and the feature portion 112 are ashed with a first mixed gas containing no oxygen. The first mixed gas comprises at least hydrogen and nitrogen to remove the corrosive gas and polymer materials remaining on the surface after etching. For the oxygen-free ashing process, since the mixed gas does not contain oxygen, it will not cause damage to the surface of the semiconductor substrate and the feature portion 112 (it will not oxidize the surface of the feature portion 112 and the semiconductor substrate 111, for example, it will not oxidize the silicon). Therefore, in this embodiment, the ashing process is performed by means of the oxygen-free ashing process. In addition, the use of hydrogen can effectively remove the corrosive gas and polymer materials remaining on the surface of the feature portion and the semiconductor substrate 111.

Oxygen ashing: the semiconductor substrate 111 and the feature portion 112 are ashed with a second mixed gas containing oxygen, and the second mixed gas comprises at least hydrogen, nitrogen, and oxygen. For the oxygen ashing process, since the mixed gas contains oxygen, the ashing efficiency is higher, and the corrosive gas and polymer materials remaining on the surface after etching may be removed more quickly. In other embodiments, the ashing process may be performed by means of the oxygen ashing process.

Figure 3:
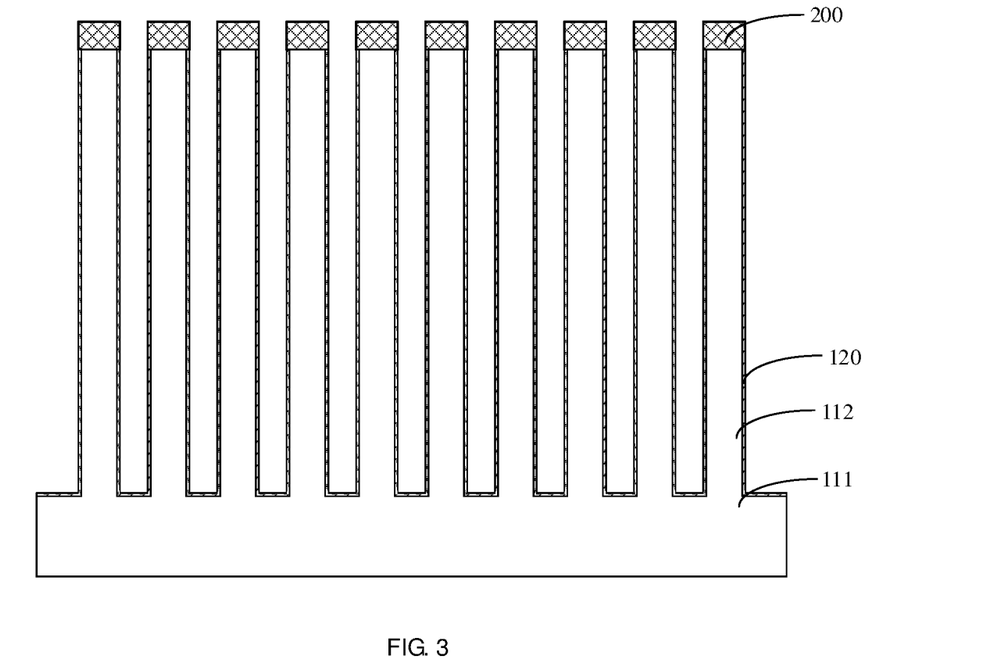
Figure 4:
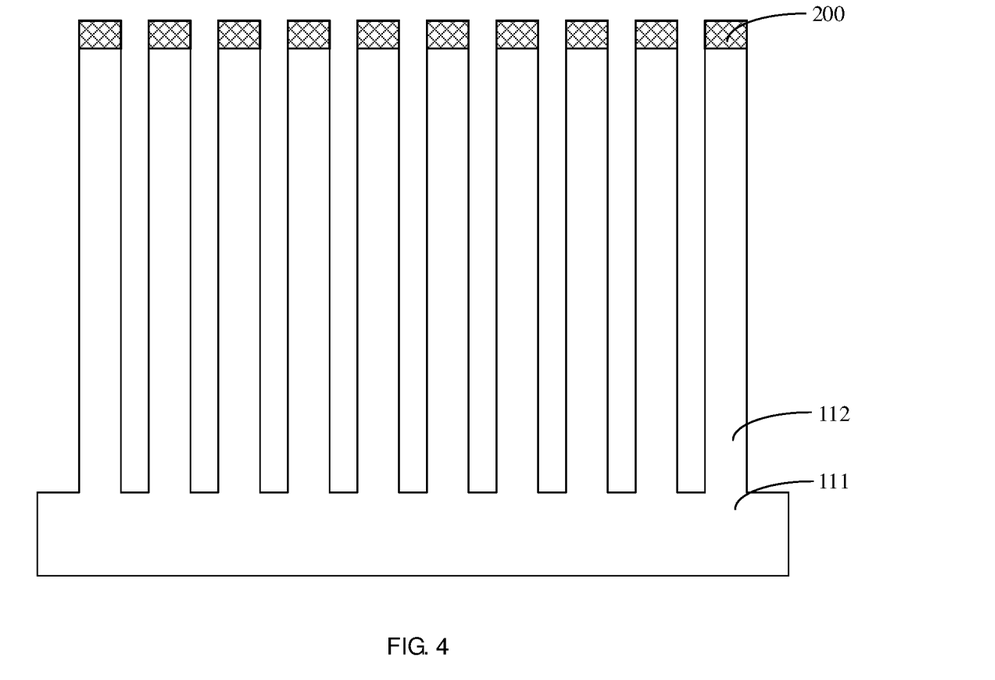

Referring to FIGS. 3 and 4, the semiconductor structure is cleaned. The semiconductor structure comprises a semiconductor substrate 111, the feature portions 112, and the mask layers 200. In this embodiment, the semiconductor substrate 111 and the feature portion 112 are cleaned.

The cleaning process comprises a first cleaning process and a second cleaning process. The first cleaning process is used to repair defects on the surface of the feature portion 112. The defects refer to recesses formed by partial sidewalls that are over-etched and protrusions formed by partial sidewalls that are not completely etched during the process of etching the feature portion 112, resulting in unevenness of the surface of the feature portion 112. The second cleaning process is used to remove the oxide layer generated in the first cleaning process.

Specifically, the semiconductor substrate 111 and the feature portion 112 are subjected to a first cleaning process. The first cleaning process is used to repair defects on the surface of the feature portion 112. After the first cleaning process, an oxide layer is formed on the surface of the semiconductor substrate 111 and the feature portion 112. The semiconductor substrate 111 and the feature portion 112 are subjected to a second cleaning process. The second cleaning process is used to remove the oxide layer.

Referring to FIG. 3, the first cleaning process uses a mixed liquid of $NH_4OH$, $H_2O_2$, and $H_2O$ (i.e., SC-1 mixed liquid), and the ratio (volume ratio) of $NH_4OH$, $H_2O_2$ and $H_2O$ is $NH_4OH:H_2O_2:H_2O=1:1-4:20-100$.

Since the mixed liquid used in the first cleaning process has strong oxidization, an oxide layer 120 will be formed on the surface of the feature portion 112 and the semiconductor substrate 111 during the cleaning process.

Referring to FIG. 4, the second cleaning process uses a mixed liquid of HF with concentration 30%-70% and $H_2O$, and the ratio (volume ratio) of HF with concentration 30%-70% and $H_2O$ is HF with concentration 30%-70%:$H_2O$=100-300:1. In this embodiment, specifically, a mixed liquid of 40%, 50% or 60% HF and $H_2O$ may be used.

The principle of the second cleaning process is $SiO_2 + 6HF \rightarrow 2H^+ + SiF_6^{2-} + 2H_2O \rightarrow H_2SiF_6$ (dissolution)$+2H_2O$. By means of chemical removal, the oxide layer ($SiO_2$) is converted into $H_2SiF_6$ soluble in water, so that the oxide layer 120 is etched and removed. At this time, the thickness of the remaining feature portion 112 and the remaining substrate 111 is thinner than that of the feature portion 112 and the semiconductor substrate 111. Due to the small thickness of the oxide layer 120, the change in thickness of the feature portion 112 and the semiconductor substrate 111 is relatively small. Therefore, in the schematic diagram in the drawings, the thickness of the remaining feature portion 112 and the remaining substrate 111 has not changed significantly. According to the above explanation, those skilled in the art should know the change in thickness of the feature portion 112 and the semiconductor substrate 111 after the second cleaning process.

Figure 5:
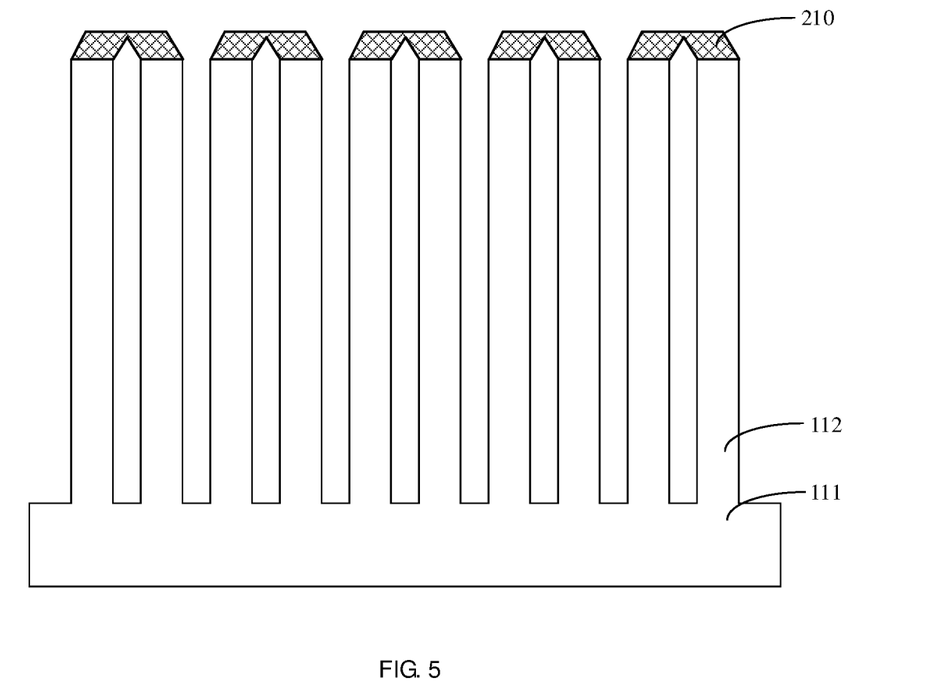

Referring to FIG. 5, after the cleaning process, the semiconductor structure is dried. The semiconductor structure comprises a semiconductor substrate 111, the feature portions 112, and the mask layers 200. In this embodiment, the semiconductor substrate 111 and the feature portion 112 are dried. Specifically, the remaining substrate 111 and the remaining feature portion 112 are dried.

The drying process comprises: drying the surface of the remaining feature portion 112 with isopropanol (IPA) at a first temperature, and drying the bottom of the semiconductor substrate 111 with deionized water at a second temperature while drying the surface of the remaining feature portion 112.

Taking the semiconductor substrate being a wafer as an example, the process is to provide hot deionized water to the back of the wafer in the drying process while providing heated isopropanol to the front of the wafer. The reason is that, if the back of the wafer is not heated, the temperature of isopropanol reaching the surface of the wafer will decrease. Providing hot deionized water to the back is to control the temperature of the wafer, to prevent the difference in temperature between the center and the edge of the wafer. This can further strengthen the drying effect of isopropanol, so as to better dry the wafer.

The first temperature ranges from 60° C. to 80° C. and the second temperature ranges from 60° C. to 80° C. In this embodiment, the first temperature or the second temperature may be 65° C., 70° C., or 75° C.

During the drying process, one mask layer 200 in at least a set of adjacent mask layers 200 is tilted toward the adjacent mask layer 200, and after the drying process, the distance between the tilted mask layer 200 and the adjacent mask layer 200 is less than the distance between the two before the drying process. In this embodiment, the description is given by taking, as an example, the case where the mask layers 200 on the top of the tilted remaining feature portions 112 are adhered to each other (the spacing between the mask layers 200 is 0).

Specifically, during the drying process, the capillary force of the chemical reagent can release a large enough force during the drying process, thereby causing the tilt of the remaining feature portion. For the principle, please refer to FIG. 7. As shown, there are two discrete protrusions (the protrusion comprises the feature portion and the mask layer on the top of the feature portion; the protrusion may be a structure with narrow top and wide bottom, a structure with equal width on top and bottom, or a structure with wide top and narrow bottom; in the drawings in this embodiment, the protrusion with equal width on top and bottom is just illustrative, and the protrusion etched in the actual manufacturing process is wider on the bottom than on the top). Due to the difference in width, the surface tension on the top of the protrusions is along the tangent γ direction. The angle between the γ direction and the vertical direction is θ. The capillary force acting on both sides of the protrusion is $F=2\gamma HDt\cos\theta/S$, where H, D, S are the height of the protrusion, the length of the protrusion, and the distance between the protrusions, respectively, and t is the action time of the capillary force F.

Figure 7:
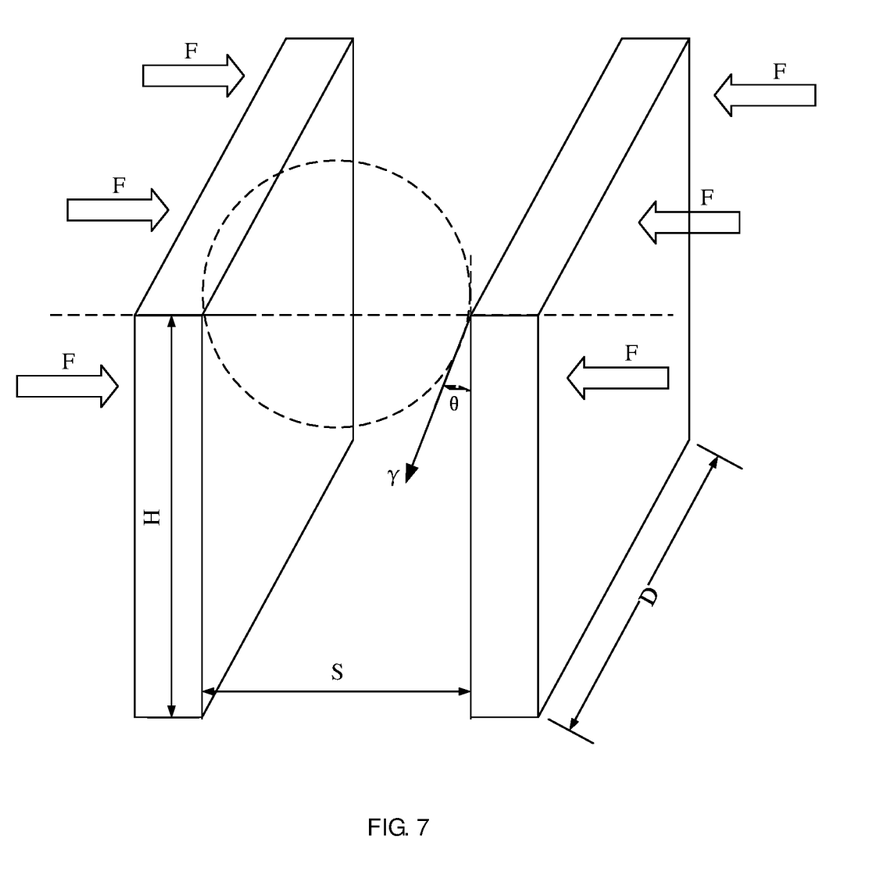
FIG. 7 is a schematic diagram of a feature portion in the method for processing a semiconductor structure according to an embodiment of the present application.

It may be known from the discussion that, when other conditions (γ, D, t, cos θ, and S) remain unchanged, the capillary force F is proportional to the height H of the protrusion. That is, the higher the protrusion is, the greater the capillary force F is, and correspondingly, the greater the tilt is. In this case, the title of the mask layer on the top of the protrusion reaches the largest, so that the mask layers are adhered to each other to form an adhesive mask layer 210. Although the remaining feature portion 112 tilts, the degree of tilt is much lower than that of the mask layer. Therefore, the remaining feature portion 112 is shown to be vertical in FIG. 5 to reflect that the remaining feature portion 112 and the mask layer have a different degree of tilt. In addition, in this embodiment, in order to ensure that the parts adhered to each other on the top must be mask layers, the thickness of the mask layers should be greater than 50 nm when the mask layers are formed.

Figure 6:
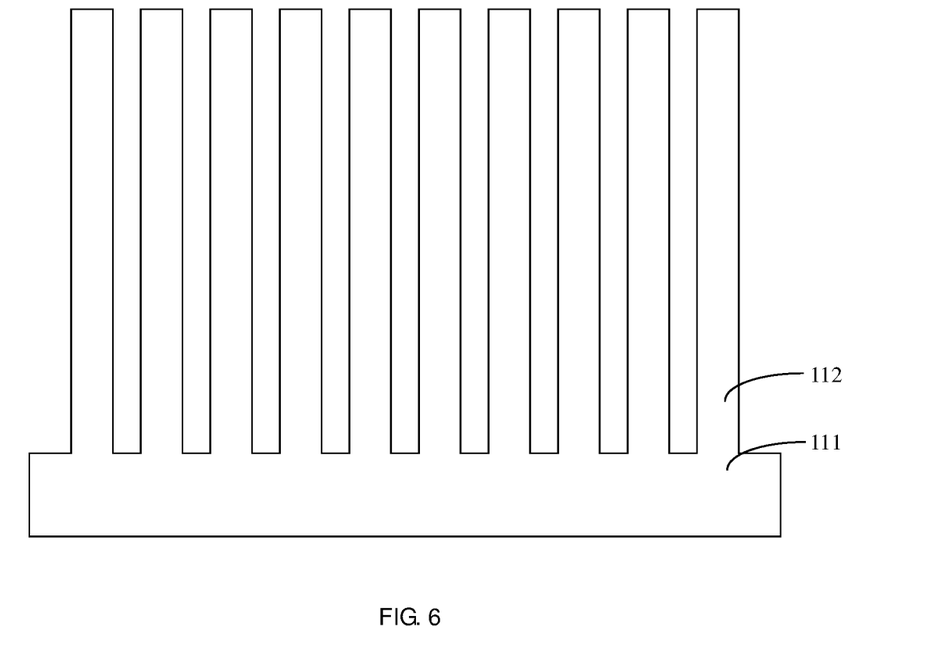

Referring to FIG. 6, after the drying process, the mask layers on the top surface of the remaining feature portion 112 are removed.

In this embodiment, after the drying process, the mask layers on the top of the remaining feature portion 112 are adhered to each other to form an adhesive mask layer 210. After the adhesive mask layer 210 is removed, due to the slight or even no tilt of the feature portion, the subsequently formed active areas are ensured to not tilt or just tilt slightly.

Specifically, a chemical method is used to remove the mask layer on the top surface of the remaining feature portion 112, and the etch selectivity ratio of the chemical gas used in the chemical method to the mask layer and the remaining feature portion 112 is greater than 500:1. With the use of a chemical gas with a high etch selectivity ratio, in the process of removing the mask layer by etching, the remaining feature portion 112 is prevented from being etched as much as possible.

Figure 8:
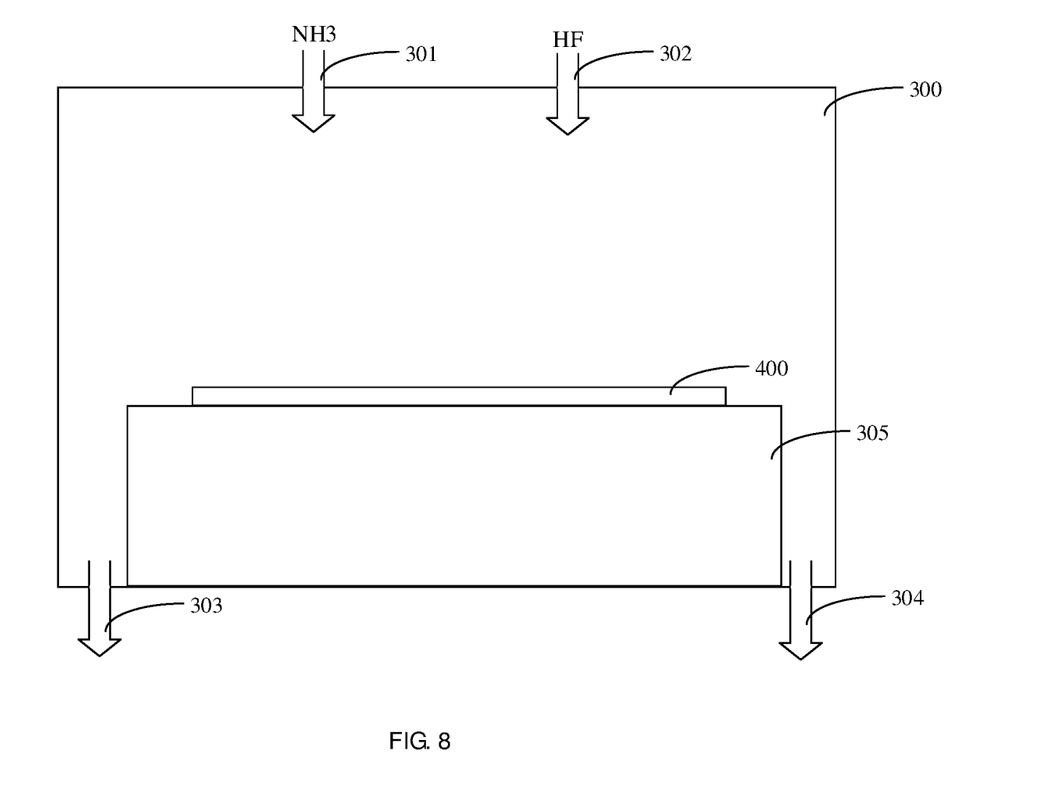
FIGS. 8 and 9 are schematic flowcharts of a chemical etching process according to an embodiment of the present application.
Figure 9:
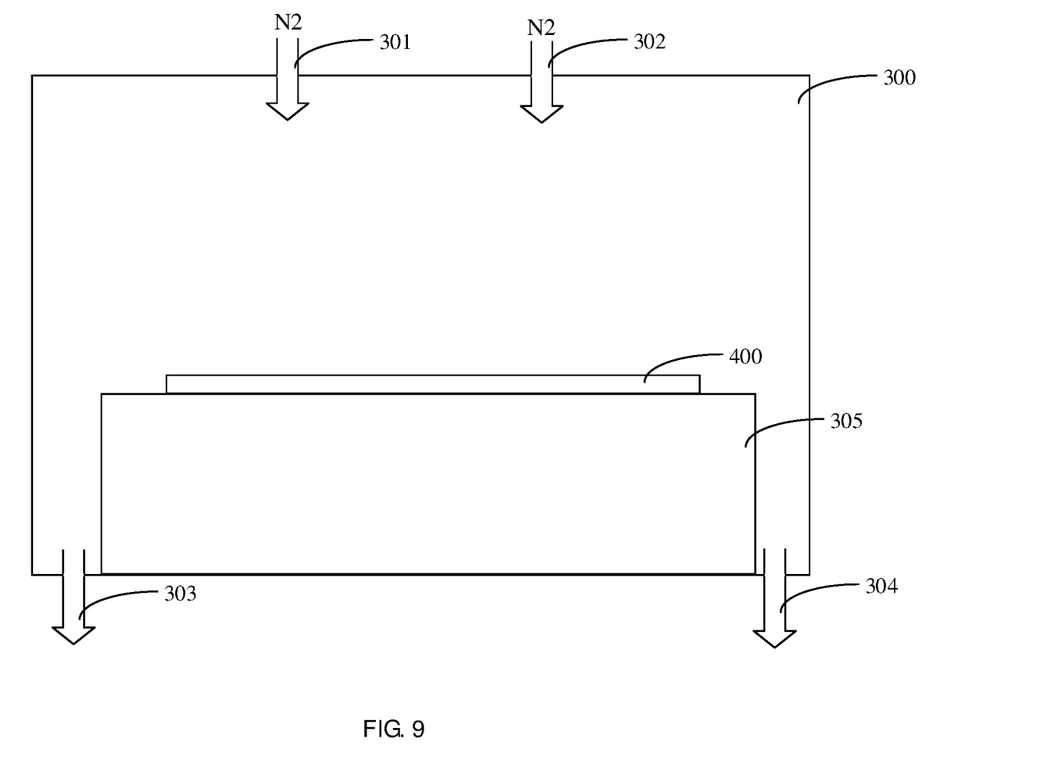

Specifically referring to FIGS. 8 and 9, the chemical method to remove the mask layer on the top surface of the remaining feature portion 112 comprises the following operations.

The entire semiconductor structure 400 is placed in a reaction chamber 300. The reaction chamber 300 comprises at least two gas inlets (a first gas inlet 301 and a second gas inlet 302), two gas outlets (a first gas outlet 303 and a second gas outlet 304), and a carrier 305 that carries the entire semiconductor structure 400.

A chemical gas is introduced into the reaction chamber 300. The chemical gas comprises at least ammonia and hydrogen fluoride. In this embodiment, the chemical gas further comprises argon.

Specifically, referring to FIG. 8, first, ammonia is introduced into the reaction chamber 300 through the first gas inlet 301, and hydrogen fluoride is introduced into the reaction chamber 300 through the second gas inlet 302. At this time, the mask layer in the entire semiconductor structure 400 on the carrier 305 reacts as follows:

$$SiO_2 + 4HF + 4NH_3 \rightarrow SiF_4 + 2H_2O + 4NH_3 \quad (1)$$

$$SiF_4 + 2HF + 2NH_3 \rightarrow (NH_4)_2SiF_6 \quad (2)$$

In the reaction (1), hydrogen fluoride reacts, as a reaction gas, with the mask layer in the entire semiconductor structure 400 to generate $SiF_4$, and ammonia is used as a catalyst to accelerate the reaction. In the reaction (2), ammonia and hydrogen fluoride further react, both as reaction gases, with $SiF_4$ generated in the first step of the reaction to generate volatile $(NH_4)_2SiF_6$ solids. At the same time, argon may be introduced to the reaction as a carrier gas. Argon can prevent hydrogen fluoride from condensing in the gas inlet pipe (in this embodiment, specifically the second gas inlet 302), in order to carry hydrogen fluoride to the entire semiconductor structure 400 for reaction.

During the reaction, it is necessary to ensure that the entire semiconductor structure 400 in the reaction chamber is at the third temperature. The temperature of the entire semiconductor structure 400 is changed by the carrier 305. The third temperature ranges from 30° C. to 150° C., and specifically may be 50° C., 70° C., 90° C., 110° C., or 130° C. In this embodiment, the third temperature is 35° C.

After the chemical reaction, the mask layer is heated at the fourth temperature and a carrier gas is provided to the mask layer at the same time, to remove the $(NH_4)_2SiF_6$ solids generated during the reaction by evaporation. Referring to FIG. 9, the entire semiconductor structure 400 is heated by the carrier 305, so that the entire semiconductor structure 400 is at the fourth temperature. The fourth temperature ranges from 100° C. to 200° C., and specifically may be 110° C., 130° C., 150° C., 170° C., or 190° C. In this embodiment, the fourth temperature is 150° C. The mask layer is heated to accelerate the volatilization of the $(NH_4)_2SiF_6$ solids. At the same time, nitrogen is introduced to the first gas inlet 301 and the second gas inlet 302 simultaneously as a carrier gas to carry the volatilized $(NH_4)_2SiF_6$ solids into the gas outlets (the first gas outlet 303 and the second gas outlet 304), thereby completing the etching of the mask layer on the top of the remaining feature portion 112.

The feature portion is a high-aspect-ratio structure. The tilt of the feature means the tilt of the high-aspect-ratio structure. The feature portion is kept to be vertical to avoid the tilt of the high-aspect-ratio structure. In the related technologies, in the process of ashing and cleaning the feature portion after it is formed by etching, the mask layer on the top of the feature portion is removed, and the feature portion is tilted due to capillary force. Compared with the related technologies, in this technical solution, the mask layer on the top of the feature portion is not removed in the process of ashing and cleaning the feature portion. After the cleaning process, the mask layer is tilted due to capillary force. After the mask layer is removed, the feature portion returns to its initial state. The tilt of the high-aspect-ratio structure caused when cleaning the high-aspect-ratio structure is effectively overcome, and the process flow is simple and the cost is low.

The division of the steps above is just for clarity of description. When implemented, the steps may be combined into one step or some steps may be split and decomposed into multiple steps, as long as they include the same logical relationship, without departing from the scope of the present application. Adding insignificant modifications to the process or introducing insignificant designs without changing the key design of the process are within the protection scope of the present application.

Another embodiment of the present application provides a method for forming a semiconductor structure, comprising: providing a semiconductor substrate and a mask layer on the semiconductor substrate; etching, by using the mask layer as a mask, the semiconductor substrate to form discrete feature portions, the aspect ratio of the feature portion being greater than a preset aspect ratio; sequentially ashing, cleaning and drying a semiconductor structure, the semiconductor structure comprising the semiconductor substrate, the feature portion, and the mask layer; and removing the mask layer.

The method for forming a semiconductor structure in this embodiment will be described in detail below with reference to the accompanying drawings.

Referring to FIGS. 1 and 2, a semiconductor substrate 111 is provided. mask layers 200 are formed on the top surfaces of the semiconductor substrate 111. By using the mask layers 200 as a mask, the semiconductor substrate 111 is etched to form discrete feature portions 112. The aspect ratio of the feature portion 112 is greater than a preset aspect ratio.

Specifically, referring to FIG. 1, a mask layer 200 is formed on a substrate 101. The substrate 101 is etched based on the mask layer 200 to form a semiconductor substrate 111 and discrete feature portions 112 as shown in FIG. 2. A mask layer 200 is provided on the feature portion 112. In this embodiment, the semiconductor substrate 111 is formed of materials such as silicon or germanium, and the mask layer 200 is formed of silicon dioxide. In other embodiments, the mask layer 200 may be formed of other insulating materials, for example silicon nitride or silicon oxynitride, etc. In addition, the feature portions 112 provided in this embodiment are used subsequently to form active areas. The tilt of the feature portions 112 will cause the tilt of the formed active areas. That is, the feature portions 112 are kept to be vertical to avoid the tilt of the active areas.

Referring to FIG. 2, the height of the feature portions 112 is H, the gap between the discrete feature portions 112 is S, and the aspect ratio H/S of the feature portions 112 is greater than a preset aspect ratio. In this embodiment, the preset aspect ratio is 10. That is, the aspect ratio of the feature portions 112 is greater than 10. Accordingly, the aspect ratio of protrusions formed by the feature portions 112 and the mask layers 200 is greater than the aspect ratio of the feature portions 112. In other embodiments, the preset aspect ratio may be 5, 8, 12, 15, etc., which may be set according to actual needs. In the semiconductor process where the feature portions have a high aspect ratio, the tilt of the feature portions 112 may be caused. It may be understood by those skilled in the art that the limitation to the aspect ratio of the feature portions 112 in this embodiment is to ensure the tilt of the feature portions 112 in the subsequent drying process, and all technical solutions in which the subsequent tilt of the feature portions 112 is ensured by the limitation to the aspect ratio should fall into the protection scope of the present application.

The semiconductor structure is ashed. The semiconductor structure comprises a semiconductor substrate 111, feature portions 112, and mask layers 200. In this embodiment, the semiconductor substrate 111 and the feature portion 112 are ashed. The ashing process is to ash the remaining etching gas or etching liquid to prevent the remaining etching gas or etching liquid from continuing to etch the semiconductor substrate 111 and the feature portion 112.

Referring to FIGS. 3 and 4, the semiconductor structure is cleaned. The semiconductor structure comprises a semiconductor substrate 111, feature portions 112, and mask layers 200. In this embodiment, the semiconductor substrate 111 and the feature portion 112 are cleaned.

The cleaning process comprises a first cleaning process and a second cleaning process. The first cleaning process is used to repair defects on the surface of the feature portion 112. The second cleaning process is used to remove the oxide layer generated in the first cleaning process.

Referring to FIG. 5, the semiconductor structure is dried. The semiconductor structure comprises a semiconductor substrate 111, feature portions 112, and mask layers 200. In this embodiment, the semiconductor substrate 111 and the feature portion 112 are dried. Specifically, the remaining substrate 111 and the remaining feature portion 112 are dried.

Referring to FIG. 6, the mask layer on the top surface of the remaining feature portion 112 is removed.

In this embodiment, after the drying process, the mask layers on the top of the remaining feature portion 112 are adhered to each other to form an adhesive mask layer 210. After the adhesive mask layer 210 is removed, due to the slight or even no tilt of the feature portion, the subsequently formed active areas are ensured to not tilt or just tilt slightly.

Since the above embodiment and this embodiment correspond to each other, this embodiment may be implemented in cooperation with the above embodiment. The relevant technical details mentioned in the above embodiment are still applicable to this embodiment, and the technical effects that can be achieved in the above embodiment can also be achieved in this embodiment. For the purpose of clarity, they will not be repeated here. Correspondingly, related technical details mentioned in this embodiment are applicable to the previous embodiment.

The division of the steps above is just for clarity of description. When implemented, the steps may be combined into one step or some steps may be split and decomposed into multiple steps, as long as they include the same logical relationship, without departing from the scope of the present application. Adding insignificant modifications to the process or introducing insignificant designs without changing the key design of the process are within the protection scope of the present application.

It may be understood by a person of ordinary skill in the art that the above embodiments are specific embodiments for realizing the present application, and in actual applications, various changes may be made to the form and details without departing from the spirit and scope of the present application.

The invention claimed is:

1. A method for forming a semiconductor structure, comprising:
    providing a semiconductor substrate and a mask layer on the semiconductor substrate;
    etching, by using the mask layer as a mask, the semiconductor substrate to form discrete feature portions, an aspect ratio of the feature portions being greater than a preset aspect ratio;
    sequentially ashing, cleaning and drying the semiconductor structure, the semiconductor structure comprising the semiconductor substrate, the feature portions, and the mask layer; and
    removing the mask layer, comprising:
        providing, to the mask layer, a chemical gas which chemically reacts with the mask layer at a third temperature such that a chemical reaction occurs; and
        after the chemical reaction, heating the mask layer at a fourth temperature while providing a carrier gas to the mask layer to remove the mask layer by evaporation.

2. The method for forming a semiconductor structure according to claim 1, wherein the preset aspect ratio is 10.

3. A method for processing a semiconductor structure, comprising:
    providing a semiconductor substrate, the semiconductor substrate being provided with feature portions, an aspect ratio of the feature portions being greater than a preset aspect ratio, mask layers being provided on a top of the feature portions;
    ashing the semiconductor structure, the semiconductor structure comprising the semiconductor substrate, the feature portions, and the mask layers;
    cleaning the semiconductor structure;
    drying the semiconductor structure; and
    removing the mask layers, comprising:
        providing, to the mask layers, a chemical gas which chemically reacts with the mask layers at a third temperature such that a chemical reaction occurs; and
        after the chemical reaction, heating the mask layers at a fourth temperature while providing a carrier gas to the mask layers to remove the mask layers by evaporation;
    wherein, during the drying, one mask layer in at least a set of adjacent mask layers of the mask layers is tilted toward an adjacent mask layer of the set of adjacent mask layers, and after the drying, a distance between the one tilted mask layer that is tilted and the adjacent mask layer is less than a distance between the one mask layer and the adjacent mask layer before the drying.

4. The method for processing a semiconductor structure according to claim 3, wherein the third temperature ranges from 30° C. to 150° C. and the fourth temperature ranges from 100° C. to 200° C.

5. The method for processing a semiconductor structure according to claim 3, wherein the preset aspect ratio is 10.

6. The method for processing a semiconductor structure according to claim 3, wherein the ashing the semiconductor structure comprises:
    ashing the semiconductor structure with a first mixed gas containing no oxygen.

7. The method for processing a semiconductor structure according to claim 6, wherein the first mixed gas comprises at least hydrogen and nitrogen.

8. The method for processing a semiconductor structure according to claim 3, wherein the ashing the semiconductor structure comprises:
    ashing the semiconductor structure with a second mixed gas containing oxygen.

9. The method for processing a semiconductor structure according to claim 8, wherein the second mixed gas comprises at least hydrogen, nitrogen, and oxygen.

10. The method for processing a semiconductor structure according to claim 3, wherein the drying the semiconductor structure comprises:

drying surfaces of the feature portions with isopropanol at a first temperature; and providing deionized water to a bottom of the semiconductor substrate at a second temperature while drying the surfaces of the feature portions.

11. The method for processing a semiconductor structure according to claim 10, wherein the first temperature ranges from 60° C. to 80° C. and the second temperature ranges from 60° C. to 80° C.

12. The method for processing a semiconductor structure according to claim 3, wherein an etch selectivity ratio of the chemical gas to the mask layers and the feature portions is greater than 500:1.

13. The method for processing a semiconductor structure according to claim 12, wherein the chemical gas comprises at least ammonia and hydrogen fluoride, and the carrier gas comprises at least nitrogen or argon.

14. The method for processing a semiconductor structure according to claim 3, wherein the cleaning the semiconductor structure comprises:

subjecting the semiconductor structure to a first cleaning process, with an oxide layer formed on a surface of the semiconductor structure after the first cleaning process; and subjecting the semiconductor structure to a second cleaning process, the second cleaning process being used to remove the oxide layer.

15. The method for processing a semiconductor structure according to claim 14, wherein the first cleaning process uses a mixed liquid of $NH_4OH$, $H_2O_2$, and $H_2O$, and a volume ratio of the $NH_4OH$, the $H_2O_2$ and the $H_2O$ is $NH_4OH:H_2O_2:H_2O=1:1-4:20-100$.

16. The method for processing a semiconductor structure according to claim 14, wherein the second cleaning process uses a mixed liquid of HF with concentration 30%-70% and $H_2O$, and a volume ratio of the HF with concentration 30%-70% and the $H_2O$ is HF with concentration 30%-70%: $H_2O=100-300:1$.

* * * * *